(12) United States Patent
Umeda et al.

(10) Patent No.: US 12,414,473 B2
(45) Date of Patent: *Sep. 9, 2025

(54) PIEZOELECTRIC ELEMENT

(71) Applicant: FUJIFILM Corporation, Tokyo (JP)

(72) Inventors: Kenichi Umeda, Ashigarakami-gun (JP); Takamichi Fujii, Ashigarakami-gun (JP); Yukihiro Okuno, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 935 days.

This patent is subject to a terminal disclaimer.

(21) Appl. No.: 17/539,343

(22) Filed: Dec. 1, 2021

(65) Prior Publication Data

US 2022/0093843 A1    Mar. 24, 2022

Related U.S. Application Data

(63) Continuation of application No. PCT/JP2020/018079, filed on Apr. 28, 2020.

(30) Foreign Application Priority Data

Jun. 12, 2019   (JP) .................................. 2019-109610

(51) Int. Cl.
*H10N 30/00*   (2023.01)
*H10N 30/853*   (2023.01)

(52) U.S. Cl.
CPC ....... *H10N 30/708* (2024.05); *H10N 30/8554* (2023.02)

(58) Field of Classification Search
CPC ............. H10N 30/708; H10N 30/8554; H10N 30/079; C01G 35/00; C01G 55/00; C01G 33/006; C23C 14/08; C23C 14/088
See application file for complete search history.

(56) References Cited

U.S. PATENT DOCUMENTS 7,622,850 B2 * 11/2009 Iwashita ................ H10N 39/00
                                                                310/358
11,985,899 B2 *  5/2024 Umeda ................ H10N 30/079
(Continued)

FOREIGN PATENT DOCUMENTS

JP        7-142600 A      6/1995
JP     2001-223403 A      8/2001
(Continued)

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2020/018079, dated Dec. 23, 2021, with an English translation.

(Continued)

*Primary Examiner* — J. San Martin
(74) *Attorney, Agent, or Firm* — Birch, Stewart, Kolasch & Birch, LLP

(57) ABSTRACT

A piezoelectric element includes, in sequence, a substrate, a lower electrode layer, a growth control layer, a piezoelectric layer including, as a main component, a perovskite-type oxide containing lead and an upper electrode layer. The growth control layer includes a metal oxide represented by $M_dN_{1-d}O_e$, where M is composed of one or more metal elements capable of substituting in the perovskite-type oxide, $0<d<1$, and when the electronegativity is X, $1.41X-1.05 \leq d \leq A1 \cdot \exp(-X/t1)+y0$, where $A1=1.68 \times 10^{12}$, $t1=0.0306$, and $y0=0.59958$.

12 Claims, 6 Drawing Sheets

(56) References Cited

U.S. PATENT DOCUMENTS

| | | | |
|---|---|---|---|
| 2004/0084994 A1 | 5/2004 | Iwashita et al. | |
| 2006/0139414 A1 | 6/2006 | Iwashita et al. | |
| 2008/0024563 A1* | 1/2008 | Matsui | B41J 2/14233 |
| | | | 310/365 |
| 2017/0133581 A1 | 5/2017 | Kobayashi et al. | |
| 2019/0013459 A1 | 1/2019 | Kijima et al. | |
| 2023/0165149 A1* | 5/2023 | Umeda | C23C 14/088 |
| | | | 310/358 |

FOREIGN PATENT DOCUMENTS

| | | |
|---|---|---|
| JP | 2005-166912 A | 6/2005 |
| JP | 2006-186258 A | 7/2006 |
| JP | 2019-16793 A | 1/2019 |
| WO | WO 2014/007015 A1 | 1/2014 |
| WO | WO 2015/194458 A1 | 12/2015 |

OTHER PUBLICATIONS

International Search Report (Form PCT/ISA/210) for International Application No. PCT/JP2020/018079, dated Jul. 14, 2020, with an English translation.
Extended European Search Report for corresponding European Application No. 20823705.7, dated Aug. 12, 2022.
Japanese Office Action for corresponding Japanese Application No. 2021-525938, dated Jul. 26, 2022, with English translation.

\* cited by examiner

PIEZOELECTRIC ELEMENT

CROSS-REFERENCE TO RELATED APPLICATIONS

This application is a Continuation of PCT International Application No. PCT/JP2020/018079 filed on Apr. 28, 2020, which claims priority under 35 U.S.C. § 119(a) to Japanese Patent Application No. 2019-109610 filed on Jun. 12, 2019. Each of the above application(s) is hereby expressly incorporated by reference, in its entirety, into the present application.

BACKGROUND OF THE INVENTION

1. Field of the Invention

The present disclosure relates to piezoelectric elements.

2. Description of the Related Art

Lead zirconate titanate ($Pb(Zr,Ti)O_3$, hereinafter referred to as PZT) thin films, which have superior piezoelectricity and ferroelectricity, are known. Because of their ferroelectricity, PZT films are used for ferroelectric random access memory (FeRAM), which is a type of non-volatile memory. Furthermore, nowadays, micro-electro-mechanical systems (MEMS) piezoelectric elements using PZT films are also being put into practical use through fusion with MEMS technology. PZT films have been used in various devices such as ink jet heads (actuators), micromirror devices, angular rate sensors, gyroscope sensors, and vibration energy harvesters.

To achieve superior piezoelectricity and ferroelectricity required for such various devices, PZT films need to be composed of a crystal of a perovskite structure. However, a pyrochlore phase tends to form as an impurity phase during the deposition of a PZT film. Because a pyrochlore phase is a paraelectric material, it degrades the dielectric constant and piezoelectric properties of the PZT film. Accordingly, there is a need for a technique for inhibiting a pyrochlore phase and thereby obtaining a PZT thin film of a perovskite single phase.

It is thought that PZT is difficult to form with a stable composition since lead (Pb) is a highly volatile, very unstable element. To stably form PZT, the Pb component needs to be controlled. In general, PZT is often grown in a Pb-excess atmosphere by taking into account the volatility of Pb. This technique is thought to allow the formation of PZT with a good perovskite structure; however, a pyrochlore phase still forms in an interfacial region (initial layer) in which initial nuclei, which are most unstable, form.

On the other hand, the introduction of a growth control layer (also called "seed layer", "buffer layer", or "orientation control layer") has been discussed to control the instability of Pb. For example, JP1995-142600A (JP-H7-142600A, Patent Literature 1) discloses a method in which $BaTiO_3$ is formed as an orientation control layer on a platinum (Pt) thin film and $PbTiO_3$ is formed thereon by chemical vapor deposition (CVD). In addition, JP2001-223403A (Patent Literature 2) discloses a method in which a PZT film with good crystallinity is formed by the use of a material having an oxygen octahedral structure as an orientation control layer.

SUMMARY OF THE INVENTION

Patent Literature 1 discloses that, by providing $BaTiO_3$ on a Pt thin film and forming a $PbTiO_3$ layer thereon, a PZT layer that has inherited the orientation of the Pt thin film can be formed. This literature also discloses that similar effects can be expected for compounds that are oxides, as is PZT, and that have lattice constants relatively close to those of PZT, and gives examples of compounds for orientation control layers, such as strontium titanate ($SrTiO_3$), barium oxide (BaO), strontium oxide (SrO), cerium oxide (CeO), and magnesium oxide (MgO).

However, in Patent Literature 1, the electrode is limited to a Pt film, and there is no discussion of the use of other electrodes.

In Patent Literature 2, a single-phase PZT film is obtained by the use of a material having an oxygen octahedral structure such as a perovskite structure as an orientation control layer. However, in Patent Literature 2, the orientation control layer is limited to a particular crystal structure since a single-phase PZT film is grown by lattice matching with the crystal structure of the orientation control layer. Thus, when a PZT film is deposited over a large area, it is necessary to control not only the composition of PZT, but also the composition of the orientation control layer, which requires more complicated control, thus decreasing the productivity and increasing the cost.

The problem that a good perovskite structure cannot be obtained due to the formation of a pyrochlore phase is not limited to PZT, but is a problem common to piezoelectric layers including a perovskite-type oxide containing Pb.

The present disclosure has been made in view of the foregoing circumstances. An object of the present disclosure is to provide, at low cost, a piezoelectric element including a piezoelectric layer including a single-phase perovskite-type oxide containing Pb.

<1>

A piezoelectric element including, in sequence:
a substrate;
a lower electrode layer;
a growth control layer;
a piezoelectric layer including, as a main component, a perovskite-type oxide containing lead; and
an upper electrode layer,
wherein the growth control layer includes a metal oxide represented by the following general formula (1):

$$M_d N_{1-d} O_e \quad (1)$$

where
M is composed of one or more metal elements capable of substituting in the perovskite-type oxide and has an electronegativity of less than 0.95,
N includes, as a main component, at least one selected from the group consisting of Sc, Zr, V, Nb, Ta, Cr, Mo, W, Mn, Fe, Ru, Co, Ir, Ni, Cu, Zn, Ga, Sn, In, and Sb,
O is oxygen, and
d and e each represent a compositional ratio, where $0 < d < 1$, and when the electronegativity is X,

$$1.41X - 1.05 \leq d \leq A1 \cdot \exp(-X/t1) + y0$$

where $A1 = 1.68 \times 10^{12}$, $t1 = 0.0306$, and $y0 = 0.59958$.

<2>

The piezoelectric element according to <1>, wherein M in general formula (1) includes, as a main component, at least one selected from the group consisting of Li, Na, K, Mg, Ca, Sr, Ba, La, Cd, and Bi.

<3>

The piezoelectric element according to <1>, wherein M in general formula (1) includes Ba as a main component.

<4>

The piezoelectric element according to <1>, wherein M in general formula (1) is Ba.

<5>

The piezoelectric element according to any one of <1> to <4>, wherein $0.2 \leq d$.

<6>

The piezoelectric element according to any one of <1> to <4>, wherein $0.3 \leq d$.

<7>

The piezoelectric element according to any one of <1> to <4>, wherein $0.45 \leq d$.

<8>

The piezoelectric element according to any one of <1> to <7>, wherein the growth control layer has a film thickness of from 0.63 nm to 170 nm.

<9>

The piezoelectric element according to any one of <1> to <7>, wherein the growth control layer has a film thickness of from 0.63 nm to 40 nm.

<10>

The piezoelectric element according to any one of <1> to <9>, wherein N in general formula (1) is at least one selected from the group consisting of Ru, Ir, Sn, Ni, Co, Ta, and Nb.

According to the present disclosure, a piezoelectric element including a piezoelectric layer of a single-phase perovskite structure containing Pb can be provided at low cost.

DESCRIPTION OF THE PREFERRED EMBODIMENTS

An embodiment of the present disclosure will be described below with reference to the drawings.

Figure 1:
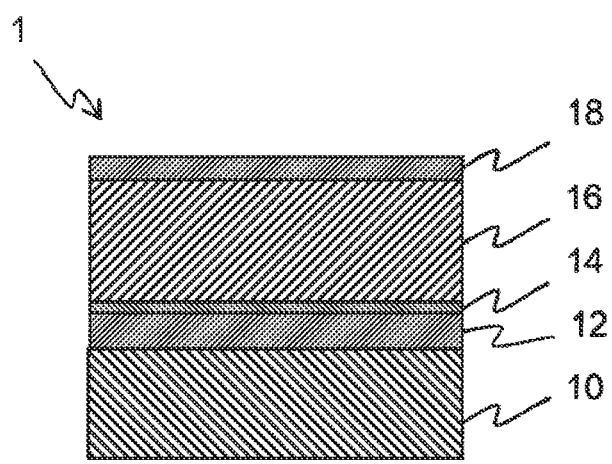
FIG. 1 is a sectional view illustrating a schematic configuration of a piezoelectric element according to one embodiment of the present disclosure.

FIG. 1 is a schematic sectional view of a piezoelectric element according to the present embodiment. As illustrated in FIG. 1, a piezoelectric element 1 is an element including, in sequence, a substrate 10, a lower electrode layer 12, a growth control layer 14, a piezoelectric layer 16, and an upper electrode layer 18. The piezoelectric element 1 is configured such that an electric field is applied to the piezoelectric layer 16 by the lower electrode layer 12 and the upper electrode layer 18 in the thickness direction.

The substrate 10 is not particularly limited, and examples thereof include substrates such as those formed of silicon, glass, stainless steel (SUS), yttrium-stabilized zirconia (YSZ), alumina, sapphire, and silicon carbide. As the substrate 10, a multilayer substrate such as an SOI substrate obtained by forming a $SiO_2$ oxide film on a surface of a silicon substrate may also be used.

The lower electrode layer 12 is an electrode for applying a voltage to the piezoelectric layer 16. The main component of the lower electrode layer 12 is not particularly limited, and examples thereof include metals such as gold (Au), Pt, iridium (Ir), ruthenium (Ru), titanium (Ti), molybdenum (Mo), tantalum (Ta), aluminum (Al), copper (Cu), and silver (Ag), metal oxides such as indium oxide (ITO: indium tin oxide), iridium oxide ($IrO_2$), ruthenium oxide ($RuO_2$), $LaNiO_3$, and $SrRuO_3$, and combinations thereof. It is particularly preferred to use Ir as the lower electrode layer 12.

The upper electrode layer 18 is an electrode, paired with the lower electrode layer 12, for applying a voltage to the piezoelectric layer 16. The main component of the upper electrode layer 18 is not particularly limited, and examples thereof include the materials given as examples for the lower electrode layer 12, electrode materials, such as chromium (Cr), that are commonly used in semiconductor processes, and combinations thereof.

In the present specification, "upper" and "lower" do not refer to "top" and "bottom"; of the pair of electrode layers disposed with the piezoelectric layer 16 therebetween, the electrode layer disposed on the substrate side is merely referred to as "lower electrode layer", and the electrode layer disposed on the opposite side from the substrate is merely referred to as "upper electrode layer".

The thicknesses of the lower electrode layer 12 and the upper electrode layer 18 are not particularly limited and are preferably about 50 nm to about 300 nm.

The piezoelectric layer 16 includes a perovskite-type oxide containing Pb as a main component of an A site (hereinafter referred to as "Pb-containing perovskite-type oxide"). The piezoelectric layer 16 is basically formed of a Pb-containing perovskite-type oxide. However, the piezoelectric layer 16 may include incidental impurities in addition to the Pb-containing perovskite-type oxide. In the present specification, an A site element of a perovskite-type oxide generally represented by the formula $ABO_3$ may be simply referred to as "A site", and a B site element thereof may be simply referred to as "B site". In the present specification, "main component" refers to a component that accounts for 50 mol % or more. That is, "containing Pb as a main component of an A site" means that Pb accounts for 50 mol % or more of the A site elements, irrespective of the other elements in the A site or the elements in the B site.

For example, a perovskite-type oxide represented by the following general formula (2) is preferred:

$$(Pb_{a1}\alpha_{a2})(Zr_{b1}Ti_{b2}\beta_{b3})O_c \qquad (2)$$

where Pb and α are A site elements, where α is at least one element other than Pb; Zr, Ti, and β are B site elements; $a1 \geq 0.5$, $b1 > 0$, $b2 > 0$, and $b3 \geq 0$; and $(a1+a2):(b1+b2+b3):c=1:1:3$ is standard, although there may be a deviation from the standard value within the range where a perovskite structure can be formed.

Examples of A site elements other than Pb in the Pb-containing perovskite-type oxide include lithium (Li), sodium (Na), potassium (K), magnesium (Mg), calcium (Ca), strontium (Sr), barium (Ba), lanthanum (La), cadmium (Cd), and bismuth (Bi). α is one of these elements or a combination of two or more of these elements.

Examples of B site elements other than Ti and Zr include scandium (Sc), vanadium (V), niobium (Nb), tantalum (Ta), chromium (Cr), molybdenum (Mo), tungsten (W), manganese (Mn), iron (Fe), ruthenium (Ru), cobalt (Co), iridium (Ir), nickel (Ni), copper (Cu), zinc (Zn), gallium (Ga), indium (In), tin (Sn), and antimony (Sb). β is one of these elements or a combination of two or more of these elements.

The film thickness of the piezoelectric layer 16 is not particularly limited and is typically 200 nm or more, for example, 0.2 μm to 5 μm. Preferably, the film thickness of the piezoelectric layer 16 is 1 μm or more.

The growth control layer 14 includes a metal oxide represented by general formula (1). The growth control layer 14 is basically formed of a metal oxide represented by general formula (1). However, the growth control layer 14 may include incidental impurities.

$$M_d N_{1-d} O_e \quad (1)$$

where M is composed of one or more metal elements capable of substituting for the A site of the Pb-containing perovskite-type oxide provided over the growth control layer 14, and has an electronegativity of less than 0.95. M preferably includes, as a main component, at least one selected from the group consisting of Li, Na, K, Mg, Ca, Sr, Ba, La, Cd, and Bi within the range where the electronegativity is less than 0.95. In the present specification, "includes, as a main component, at least one" means that the main component may be composed of only one element or may be composed of a combination of two or more elements. M may include metal elements, capable of substituting for the A site, other than the metal elements mentioned above. If M is composed of two or more metal elements, the electronegativity of M is defined as the sum of the electronegativities of the individual metal elements multiplied by the respective proportions of those metal elements in M.

N includes, as a main component, at least one selected from the group consisting of Sc, Zr, V, Nb, Ta, Cr, Mo, W, Mn, Fe, Ru, Co, Ir, Sn, Ni, Cu, Zn, Ga, In, and Sb. N is composed of a metal species that can function as a B site element in the Pb-containing perovskite-type oxide. N may include B site elements other than the metal elements mentioned above.

O is oxygen.

In addition, d and e each represent a compositional ratio, where 0<d<1, and when the electronegativity of M is X, $$1.41X - 1.05 \leq d \leq A1 \cdot \exp(-X/t1) + y0$$

where $A1 = 1.68 \times 10^{12}$, $t1 = 0.0306$, and $y0 = 0.59958$.

The compositional ratio e varies depending on the valences of M and N.

Whether or not a certain element is a metal element capable of substituting for the A site of the Pb-containing perovskite-type oxide, or an element capable of substituting for the B site, is determined by the relative ionic sizes, i.e., ionic radii, of the A, B, and O ions. According to Netsu Sokutei 26 (3) 64-75, in perovskite-type oxides, the A site is in 12-fold coordination, and the B site is in 6-fold coordination; therefore, the formation of a perovskite-type structure depends on the sizes of AO and BO₂ layers stacked alternately. As a quantitative measure thereof, the tolerance factor t is expressed by the following equation:

$$t = (rA + rO)/\{\sqrt{2}(rB + rO)\}$$

where rA, rB, and rO are the ionic radii of the A, B, and O ions, respectively, at their respective positions.

In general, a perovskite-type oxide appears around t=1.05 to 0.90, and the ideal perovskite-type structure is achieved at t=1. In the present specification, elements capable of substituting for the A site and elements capable of substituting for the B site are defined as elements that satisfy a tolerance factor of 1.05 to 0.90. The ionic radii used herein are those listed in the table of ionic radii created by Shannon. Shannon's ionic radii are shown in R. D. Schannon, Acta Crystallogr. A32, 751 (1976).

The inventors have found that the presence of a growth control layer satisfying the above conditions allows the formation of a piezoelectric layer formed of a single-phase perovskite-type oxide that is free of a pyrochlore phase (see Test 1 described later). Here, "free of a pyrochlore phase" means that no diffraction peak corresponding to a pyrochlore phase is observed in a normal X-ray diffraction (XRD) measurement.

By controlling the compositional ratio of M, which is a metal element capable of substituting for the A site in the growth control layer, within the above range using the electronegativity X of M as a parameter, a single-layer Pb-containing perovskite-type oxide layer can be deposited without the formation of a pyrochlore phase. Because of the wide acceptable range of compositional ratios d of $M_d N_{1-d} O_e$, the complexity of temperature control during the deposition of the growth control layer over a large area can be reduced, thus avoiding high cost.

Growth control layers in the related art are limited to those having a perovskite structure or an oxygen octahedral structure. However, by controlling the electronegativity within a suitable range, it is possible to use not only a growth control layer having an octahedral structure such as a perovskite oxygen structure, but also a growth control layer formed of an amorphous structure.

In the related art, PZT with good crystallinity is obtained by microscopically epitaxially growing PZT on a growth control layer serving as a seed crystal. In contrast, lattice matching does not necessarily have to be performed in the present disclosure. Because the growth control layer includes an element capable of substituting for the A site of the Pb-containing perovskite oxide, a pseudo-Pb atmosphere can be created near the interface, where a shortage of Pb tends to occur. This will allow a perovskite structure to be stably formed from the initial stage of the formation of the piezoelectric layer. It is thought that some of the A sites of the perovskite structure at the interface of the piezoelectric layer with the growth control layer are constituted by M in the growth control layer; however, it has no influence on piezoelectricity since the Pb-containing perovskite is not doped in its entirety with M. In addition, because a perovskite structure is formed at the interface under the action of M, the formation of a pyrochlore phase can be inhibited, and a piezoelectric layer can be formed without the formation of a pyrochlore phase. In particular, because an oxide including a metal element having very high reactivity, i.e., an electronegativity of less than 0.95, is used as the growth control layer, the growth control layer is highly effective in supplementing A sites where Pb has been lost at the initial stage of deposition and can therefore promote the formation of a perovskite structure and stably grow a Pb-containing perovskite oxide.

The presence of a growth control layer satisfying the above conditions can broaden the acceptable range of amounts of Pb in the piezoelectric layer provided on the growth control layer. For example, when the piezoelectric layer is formed of $Pb_a(Zr_{b1}Ti_{b2}X_{b3})O_3$, perovskite can be formed over a very wide range of compositions, i.e., $0.9 \leq a \leq 1.5$ (see the Examples described later).

In the growth control layer 14, M preferably includes Ba as a main component, and particularly preferably, M is Ba. It is preferred that M include 50 mol % or more Ba since the acceptable range of d can be greatly broadened. Particularly preferably, M is Ba.

If M includes Ba, the deposition temperature of the piezoelectric layer provided on the growth control layer can be greatly reduced compared to cases where there is no growth control layer or a growth control layer containing no Ba is provided.

In $M_dN_{1-d}O_e$, 0.2≤d is preferred, 0.3≤d is more preferred, and 0.45≤d is particularly preferred.

If d is 0.2 or more, the number of options for the element species that can be used as M can be increased. If d is 0.3 or more, or 0.45 or more, the number of options for the element species can be further increased.

The growth control layer 14 preferably has a film thickness of from 0.63 nm to 170 nm, more preferably from 0.63 nm to 40 nm, particularly preferably from 0.63 nm to 10 nm. If the growth control layer 14 has a film thickness of 0.63 nm or more, the growth control layer 14 is sufficiently effective in inhibiting a pyrochlore phase. If the growth control layer 14 has a film thickness of 40 nm or less, the growth control layer 14 is highly effective in obtaining a good perovskite phase.

In addition, N is preferably Ru, Ir, Sn, Zr, Ta, Ni, Co, or Nb. If N is any of these metals, a target for use in sputter deposition can be easily fabricated with high density since different phases are unlikely to appear. In particular, Ru, Ir, and Sn can form a growth control layer with high conductivity; therefore, the growth control layer can also function as a portion of the lower electrode.

Test 1

The conditions for the above growth control layer were determined based on the results of evaluations performed on samples of growth control layers fabricated with different compositions. The methods for fabrication and evaluation of the samples used for determination of the conditions for the growth control layer will be described below.

Sample Fabrication Method

Deposition Substrate

As deposition substrates, 25 mm square Si substrates, having a 1 μm thick thermal oxide film formed thereon, on which a 10 nm thick Ti adhesion layer and a 150 nm thick Ir lower electrode layer were stacked in sequence were used.

Deposition of Growth Control Layer

A sputtering apparatus manufactured by Pascal Co., Ltd. and capable of independently controlling a plurality of targets was used. The substrates with a lower electrode were mounted in the sputtering apparatus. Argon (Ar) was allowed to flow such that the degree of vacuum was 0.8 Pa, and the sputtering apparatus was set such that the substrate temperature was 500° C. A co-sputtering technique using a plurality of targets was employed for deposition of growth control layers with different compositional ratios. By arranging a plurality of targets during co-sputtering such that the targets are located diagonally with respect to the substrate, rather than exactly under the substrate, the targets can be simultaneously sputtered in the same environment. By controlling the power supplied to each target during deposition, growth control layers with different compositions were deposited.

Before the deposition of growth control layers with different compositional ratios, a growth control layer composition evaluation was performed in advance to determine the conditions for obtaining a growth control layer with the desired compositional ratio. Specifically, substrates were separately prepared for the growth control layer composition evaluation, and the composition evaluation was performed by X-ray fluorescence (XRF) to determine the conditions for the composition. An Axios X-ray fluorescence spectrometer manufactured by PANalytical was used as the evaluation apparatus. In the condition determination process, the layer for the composition evaluation had a film thickness of 300 nm to achieve sufficient X-ray fluorescence intensity. A Dektak 6M stylus film thickness gauge manufactured by ULVAC, Inc. was used for film thickness measurement. In the condition determination, the composition was controlled by adjusting the power supplied to each target during sputter deposition. In addition, the deposition time was adjusted to achieve the desired film thickness. The thus-determined conditions were used to fabricate samples including growth control layers shown in Table 2 described later.

Deposition of Piezoelectric Layer

A radio-frequency (RF) sputtering apparatus (MPS series sputtering apparatus manufactured by ULVAC, Inc.) was used as the deposition apparatus. $Pb_x(Zr_{0.52-d/2}Ti_{0.48-d/2}Nb_d)$ sintered targets with a diameter of 120 mm were used. Here, four targets in which the amount of Nb doping was d=0.12 and x=1.0, 1.15, 1.2, or 1.3 was provided. The distance between the target and the substrate was 60 mm.

The substrates with a lower electrode and a growth control layer were mounted in the RF sputtering apparatus, and a 1.0 μm thick Nb-doped PZT film (hereinafter simply referred to as "PZT film") was deposited as a piezoelectric layer in an $Ar/O_2$ mixed atmosphere ($O_2$ volume fraction=2.0%) at a degree of vacuum of 0.3 Pa. When a sample including no growth control layer was fabricated, a piezoelectric layer was deposited in the same manner as above except that a substrate with a lower electrode but no growth control layer was mounted in the sputtering apparatus.

The substrate temperature setting was 500° C. to 750° C., and a power of 500 W was supplied to the target.

For each of the growth control layers with different compositions, the lowest temperature at which a PZT film having a good perovskite structure free of a pyrochlore phase could be deposited in the range of 500° C. to 750° C. was examined. PZT films were deposited on growth control layers having the same composition at different substrate temperatures (deposition temperatures) in the range of 500° C. to 750° C. to fabricate a plurality of subsamples including PZT films deposited at different temperatures for each Sample No.

The relationship between the Pb compositional ratio x of the target materials, the deposition temperature, and the Pb compositional ratio α1 of the PZT films after deposition was as shown in Table 1. The amount of Nb doping in the B site of the PZT films after deposition was 14.1 mol % irrespective of the deposition temperature or the amount of Pb.

TABLE 1

| Deposition temperature (° C.) | Target Pb compositional ratio x | | | |
| --- | --- | --- | --- | --- |
| | 1.00 | 1.15 | 1.20 | 1.30 |
| | Pb compositional ratio α1 of PZT film after deposition | | | |
| 550 | 0.961 | 1.261 | 1.302 | — |
| 575 | 0.873 | 1.212 | 1.251 | — |
| 600 | 0.771 | 1.163 | 1.201 | 1.451 |
| 650 | 0.672 | 1.065 | 1.121 | 1.352 |
| 750 | — | 0.862 | 0.901 | 1.081 |

Evaluation Methods

PZT Deposition Temperature Evaluation

A PZT crystallinity evaluation was performed by X-ray diffraction (XRD) using RINT-ULTIMA III manufactured by Rigaku Corporation. The intensity of a different phase, i.e., a pyrochlore phase, was calculated from the resulting data. The region where pyrochlore is detected is around 29° in XRD.

An XRD measurement was performed on each subsample. It was determined that a good perovskite structure was formed when no peak corresponding to a pyrochlore phase was observed around a diffraction angle of 29°. When there were a plurality of samples that had a good perovskite structure among the plurality of subsamples that differed in deposition temperature and Pb compositional ratio x, the results for the subsamples obtained at the lowest deposition temperature are shown in Table 2. On the other hand, the temperature is not shown in Table 2 for samples that did not have a good perovskite structure in the temperature range of 500° C. to 750° C. since there was no temperature at which a PZT film was deposited.

PZT Composition Evaluation

A composition evaluation was performed on the resulting PZT films by XRF to determine their compositions. The amount of Pb in the A site varies depending on the deposition temperature because of its instability. Accordingly, the amount of Pb was defined as Pb/(Zr+Ti+Nb). The amounts of B site elements are constant irrespective of the deposition temperature; therefore, their compositional ratios were calculated such that Zr+Ti+Nb=1.

PZT Crystallinity Evaluation

A PZT crystallinity evaluation was performed by XRD using RINT-ULTIMA III manufactured by Rigaku Corporation. The intensity of a different phase, i.e., a pyrochlore phase, was calculated and evaluated from the resulting data. The region where a pyrochlore phase is detected is around 29° in XRD, i.e., the (222) plane. The resulting diffraction intensity of the (222) plane of a pyrochlore phase around 29° in XRD was rated on the following scale:

A: 100 cps or less
B: more than 100 cps to 1,000 cps
C: more than 1,000 cps 100 cps is a level similar to that of noise, and the absence of a peak exceeding 100 cps around 29° indicates that a pyrochlore phase is not present at a detectable level in XRD. Within the range of rating B, a pyrochlore phase is sufficiently inhibited compared to the related art, and the decrease in piezoelectricity is within the acceptable range. In Table 2, 100 cps or less is denoted as $1 \times 10^2$, and 10,000 cps or more is denoted as $1 \times 10^5$.

Table 2 shows the composition, electronegativity, and compositional ratio d of M, the composition of N, and the lower limit of the deposition temperature of PZT for each sample. Table 2 also shows the intensity of a pyrochlore phase and the rating results for each sample.

TABLE 2

| Sample No. | Growth control layer | | | | | | PZT film | | |
|---|---|---|---|---|---|---|---|---|---|
| | M | | | | | | PZT deposition | Evaluation | |
| | Ba | Sr | La | Electro-negativity | d | N | temperature (° C.) | Pyrochlore intensity | Rating |
| 1 | 1 | 0 | 0 | 0.89 | 0 | Ru | — | $1 \times 10^5$ | C |
| 2 | 1 | 0 | 0 | 0.89 | 0.1 | | — | $1 \times 10^4$ | C |
| 3 | 1 | 0 | 0 | 0.89 | 0.2 | | 575 | $5 \times 10^2$ | B |
| 4 | 1 | 0 | 0 | 0.89 | 0.3 | | 550 | $1 \times 10^2$ | A |
| 5 | 1 | 0 | 0 | 0.89 | 0.45 | | 550 | $1 \times 10^2$ | A |
| 6 | 1 | 0 | 0 | 0.89 | 0.5 | | 550 | $1 \times 10^2$ | A |
| 7 | 1 | 0 | 0 | 0.89 | 0.63 | | 550 | $1 \times 10^2$ | A |
| 8 | 1 | 0 | 0 | 0.89 | 0.72 | | 550 | $1 \times 10^2$ | A |
| 9 | 1 | 0 | 0 | 0.89 | 1 | | 525 | $1 \times 10^2$ | A |
| 10 | 1 | 0 | 0 | 0.89 | 0.15 | Ta | — | $1 \times 10^5$ | C |
| 11 | 1 | 0 | 0 | 0.89 | 0.45 | | 575 | $1 \times 10^2$ | A |
| 12 | 1 | 0 | 0 | 0.89 | 0.55 | | 575 | $1 \times 10^2$ | A |
| 13 | 0.22 | 0.17 | 0 | 0.92 | 0.39 | Ru | 550 | $1 \times 10^2$ | A |
| 14 | 0.06 | 0.28 | 0 | 0.94 | 0.35 | | 550 | $1 \times 10^2$ | A |
| 15 | 0.33 | 0.22 | 0 | 0.91 | 0.55 | | 550 | $1 \times 10^2$ | A |
| 16 | 0.75 | 0.08 | 0 | 0.9 | 0.83 | | 550 | $1 \times 10^2$ | A |
| 17 | 0.21 | 0.49 | 0 | 0.93 | 0.7 | | 550 | $1 \times 10^2$ | A |
| 18 | 0.11 | 0.41 | 0 | 0.94 | 0.52 | | 550 | $1 \times 10^2$ | A |
| 19 | 0.16 | 0.1 | 0 | 0.91 | 0.26 | | 550 | $1 \times 10^2$ | A |
| 20 | 0 | 1 | 0 | 0.95 | 0 | Ru | — | $1 \times 10^5$ | C |
| 21 | 0 | 1 | 0 | 0.95 | 0.1 | | — | $3 \times 10^4$ | C |
| 22 | 0 | 1 | 0 | 0.95 | 0.2 | | — | $5 \times 10^3$ | C |
| 23 | 0 | 1 | 0 | 0.95 | 0.3 | | 600 | $5 \times 10^2$ | B |
| 24 | 0 | 1 | 0 | 0.95 | 0.35 | | 600 | $1 \times 10^2$ | A |
| 25 | 0 | 1 | 0 | 0.95 | 0.46 | | 600 | $1 \times 10^2$ | A |
| 26 | 0 | 1 | 0 | 0.95 | 0.55 | | 600 | $1 \times 10^2$ | A |
| 27 | 0 | 1 | 0 | 0.95 | 0.7 | | — | $1 \times 10^4$ | C |
| 28 | 0 | 1 | 0 | 0.95 | 1 | | — | $1 \times 10^5$ | C |
| 29 | 0 | 0 | 1 | 1.1 | 0 | Ru | — | $1 \times 10^5$ | C |
| 30 | 0 | 0 | 1 | 1.1 | 0.2 | | — | $1 \times 10^5$ | C |
| 31 | 0 | 0 | 1 | 1.1 | 0.3 | | — | $4 \times 10^4$ | C |
| 32 | 0 | 0 | 1 | 1.1 | 0.5 | | 600 | $8 \times 10^2$ | B |
| 33 | 0 | 0 | 1 | 1.1 | 0.6 | | 600 | $1 \times 10^2$ | A |

TABLE 2-continued

| | | Growth control layer | | | | PZT film | | |
| | | | M | | | PZT deposition | Evaluation | |
| Sample No. | Ba | Sr | La | Electro-negativity | d | N | temperature (° C.) | Pyrochlore intensity | Rating |
|---|---|---|---|---|---|---|---|---|---|
| 34 | 0 | 0 | 1 | 1.1 | 0.65 | | — | $1 \times 10^5$ | C |
| 35 | 0 | 0 | 1 | 1.1 | 0.72 | | — | $1 \times 10^5$ | C |
| 36 | 0 | 0 | 1 | 1.1 | 1 | | — | $1 \times 10^5$ | C |

Sample Nos. 1 to 9 are samples in which, as a growth control layer, $Ba_dRu_{1-d}O_e$, where M=Ba and N=Ru, was used, with d being varied. M, i.e., Ba, has an electronegativity of 0.89.

Sample Nos. 10 to 12 are samples in which, as a growth control layer, $Ba_dTa_{1-d}O_e$, where M=Ba and N=Ta, was used, with d being varied. Ba has an electronegativity of 0.89.

Sample Nos. 13 to 19 are samples in which, as a growth control layer, $(Ba,Sr)_dRu_{1-d}O_e$, where M=Ba,Sr and N=Ru, was used, with the ratio of Ba to Sr being varied so that the electronegativity of M varied in the range of 0.90 to 0.94, and also with d being varied.

Sample Nos. 20 to 28 are samples in which, as a growth control layer, $Sr_dRu_{1-d}O_e$, where M=Sr and N=Ru, was used, with d being varied. Sr has an electronegativity of 0.95.

Sample Nos. 29 to 36 are samples in which, as a growth control layer, $La_dRu_{1-d}O_e$, where M=La and N=Ru, was used, with d being varied. La has an electronegativity of 1.1.

Figure 2:
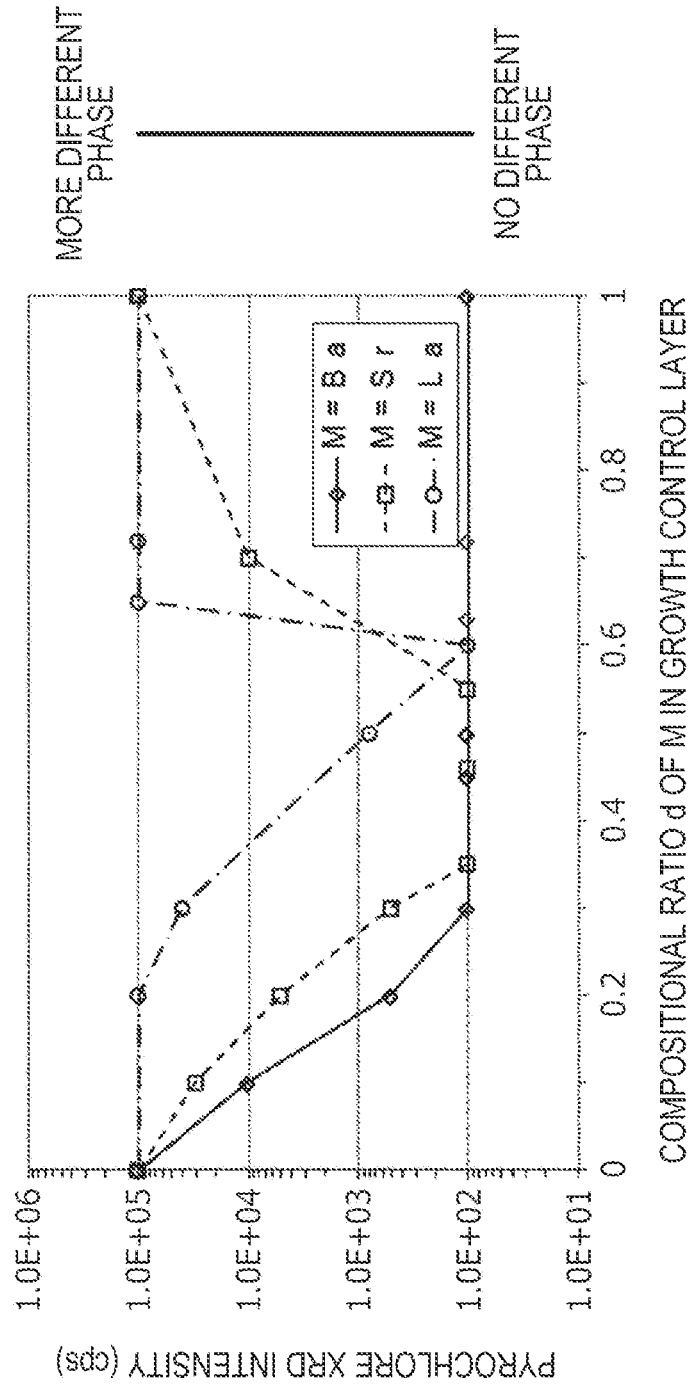
FIG. 2 is a graph showing the relationship between the compositional ratio d of a growth control layer and the XRD intensity of a pyrochlore phase.

FIG. 2 shows the relationship between the compositional ratio d of M in the growth control layer and the XRD intensity of a pyrochlore phase for each of Samples Nos. 1 to 9, in which $Ba_dRu_{1-d}O_e$ was used as a growth control layer, Samples Nos. 20 to 28, in which $Sr_dRu_{1-d}O_e$ was used as a growth control layer, and Samples Nos. 29 to 36, in which $La_dRu_{1-d}O_e$ was used as a growth control layer.

As shown in FIG. 2, when Ba was used, a PZT film in which a pyrochlore phase was sufficiently inhibited was obtained over a very wide composition range, i.e., 0.2≤d.

The range of compositional ratios d in which the XRD intensity of a pyrochlore phase satisfied $10^3$ or less was extracted from FIG. 2 for each of the cases where M was La, Sr, or Ba, as shown in Table 3.

TABLE 3

| M | Electronegativity (X) | Compositional lower limit ($M_{min}$) | Compositional upper limit ($M_{max}$) |
|---|---|---|---|
| La | 1.1 | 0.5 | 0.6 |
| Sr | 0.95 | 0.3 | 0.63 |
| Ba | 0.89 | 0.2 | 1 |

Figure 3:
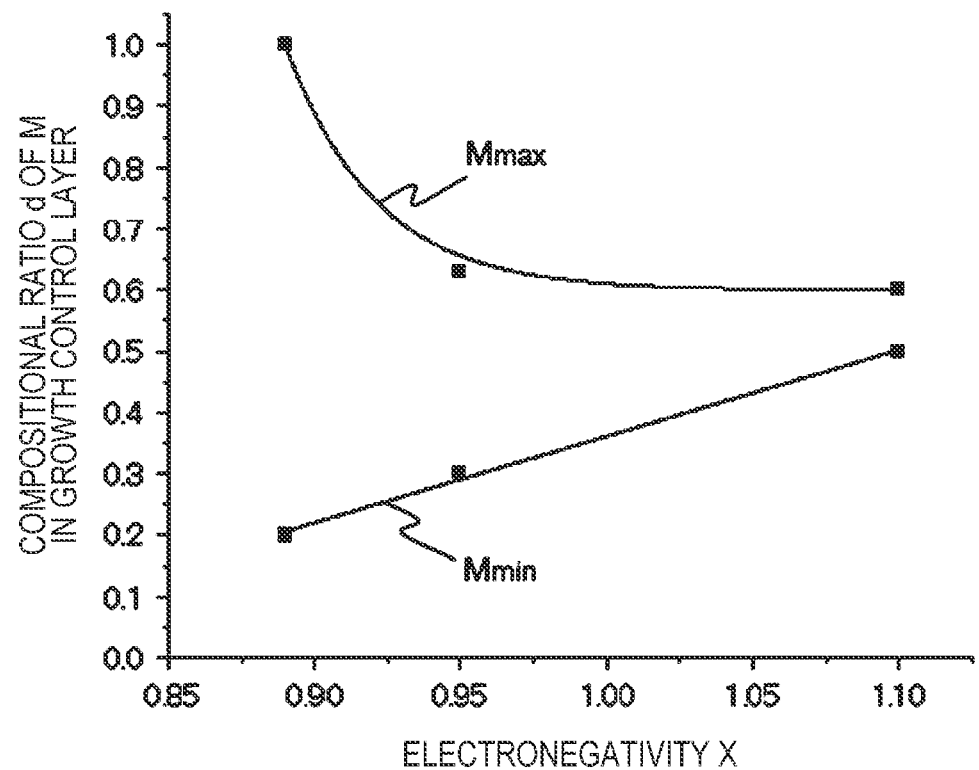
FIG. 3 is a graph showing the relationship between electronegativity and the compositional ratio d of a growth control layer.

FIG. 3 shows a graph plotting the compositional lower and upper limits, with the horizontal axis indicating the electronegativity of M and the vertical axis indicating the compositional ratio d shown in Table 3. In FIG. 3, fitting was performed using a straight line for the compositional lower limit and a curve for the compositional upper limit. The straight line indicating the compositional lower limit $M_{min}$ and the curve indicating the compositional upper limit $M_{max}$ were represented as a function of the electronegativity X by the following equations:

$$M_{min} = 1.41X - 1.05$$

$$M_{max} = A1 \cdot \exp(-X/t1) + y0$$

where $A1 = 1.68 \times 10^{12}$, $t1 = 0.0306$, and $y0 = 0.59958$.

It is presumed that a pyrochlore phase can be sufficiently inhibited in the region between the compositional lower limit and the compositional upper limit, that is, when the compositional ratio d of M is in the range of $M_{min} \leq d \leq M_{max}$.

$$1.41X - 1.05 \leq d \leq A1 \cdot \exp(-X/t1) + y0$$

As shown in FIG. 3, as the electronegativity X becomes lower, the possible range of compositional ratios d becomes broader. Because the possible range of compositional ratios d becomes rapidly broader at electronegativity X=0.95, the electronegativity was specified as less than 0.95. As the possible range of compositional ratios d becomes broader, the acceptable range of in-plane compositional variations during deposition over a large area becomes broader, which allows for simplification of control during deposition, such as temperature control, and thus allows for low-cost manufacture.

Figure 4:
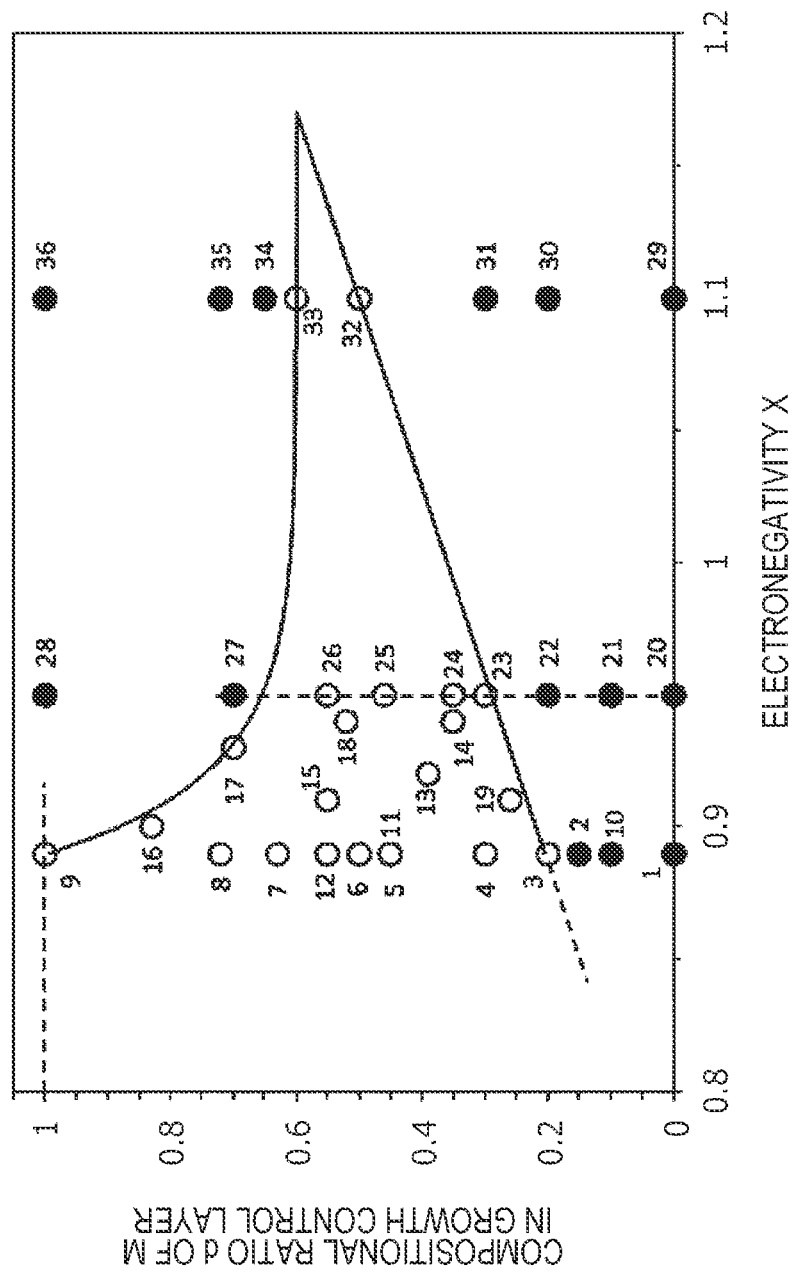
FIG. 4 is a graph showing the relationship between electronegativity and the compositional ratio d of a growth control layer.

FIG. 4 shows a graph plotting the compositional ratio d on the vertical axis against the electronegativity on the horizontal axis for each sample shown in Table 2. In FIG. 4, $M_{max}$ and $M_{min}$ are also shown. In FIG. 4, samples rated as A or B for pyrochlore phase are denoted by white circular markers (○) in Table 2, whereas samples rated as C are denoted by black circular markers (●). Numbers beside the markers represent Sample Nos. As shown in FIG. 4, all the samples in the region between the functions $M_{max}$ and $M_{min}$ were samples rated as A or B.

As discussed above, based on the above test results, the possible electronegativity and compositional ratio of the growth control layer according to the present disclosure were specified as $M_{max} \leq d \leq M_{min}$ and X<0.95.

If Ba is used as M, a piezoelectric layer formed of a Pb-containing perovskite-type oxide that is free of a pyrochlore phase can be obtained when 0.2 d. When 0.3 d, the possible range of electronegativity can be broadened, and accordingly the number of options for M can be increased.

If M includes K, which has a lower electronegativity than Ba, the electronegativity can be decreased, in which case it is thought that the lower limit of d can be reduced.

Test 2

Samples including $Ba_{0.45}Ru_{0.55}O$ growth control layers with varying film thicknesses were fabricated and examined for the dependence of the crystallinity of the PZT film on the film thickness of the growth control layer. The fabrication method was the same as the above sample fabrication method, and only the film thickness of the growth control layer was varied in the range of 0.5 nm to 170 nm.

Figure 5:
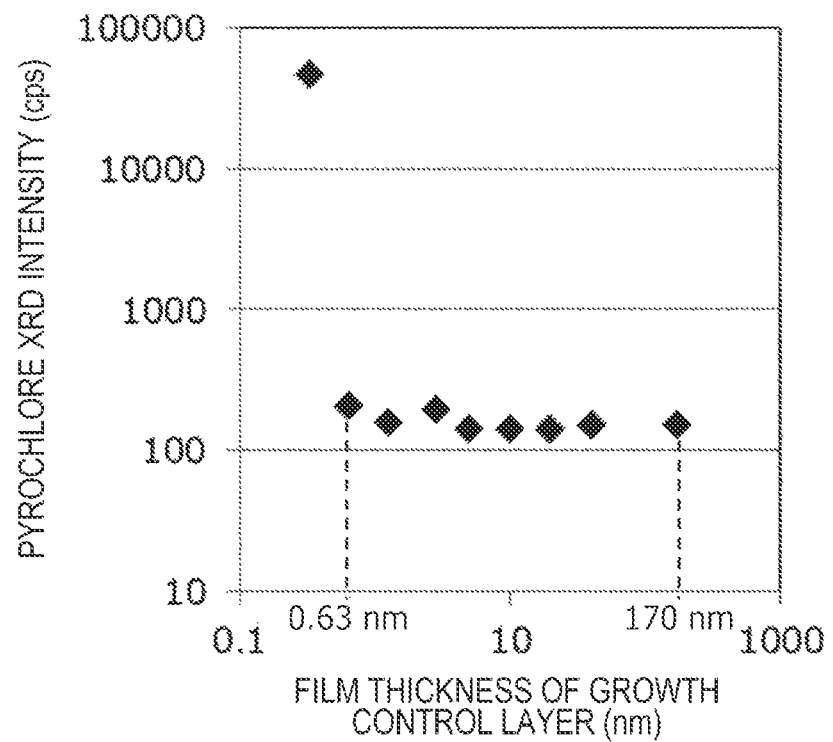
FIG. 5 is a graph showing the relationship between the film thickness of a growth control layer and the XRD intensity of a pyrochlore phase.

The XRD intensity of a pyrochlore phase in the piezoelectric layer of each sample was measured as in the above PZT crystallinity evaluation. The results are shown in FIG. 5. FIG. 5 is a graph showing the relationship between the film thickness of the growth control layer and the diffraction intensity of a pyrochlore phase.

As shown in FIG. 5, it was found that a growth control layer having a film thickness of 0.63 nm or more is sufficiently effective in inhibiting a pyrochlore phase.

Figure 6:
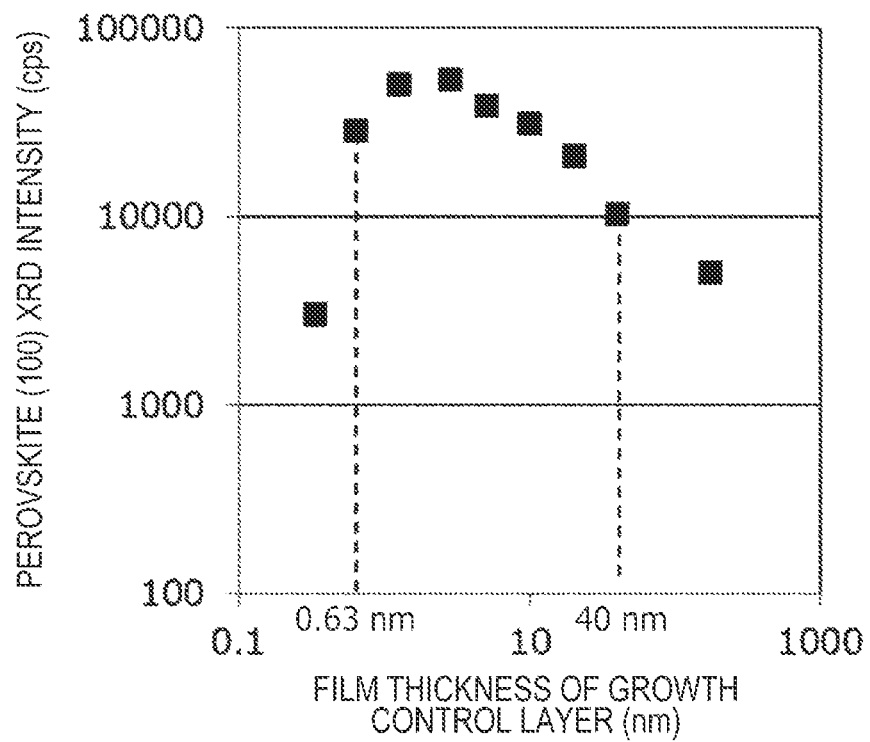
FIG. 6 is a graph showing the relationship between the film thickness of a growth control layer and the XRD intensity of (100) of a perovskite structure.

In addition, an XRD measurement was performed on the piezoelectric layer of each sample as in the PZT crystallinity evaluation. Here, the XRD intensity corresponding to (100) of a perovskite structure was calculated from the obtained data. A higher peak intensity corresponding to (100) of a perovskite structure indicates that the resulting perovskite-type oxide had better crystallinity. The results are shown in FIG. 6. FIG. 6 is a graph showing the relationship between the film thickness of the growth control layer and the XRD intensity corresponding to (100) of a perovskite structure.

As shown in FIG. 6, it was found that the diffraction intensity peaks at a film thickness of about 5 nm, and a piezoelectric layer with the best crystallinity can be obtained. The diffraction intensity decreases as the film thickness increases above 5 nm. A film thickness of 40 nm or less is preferred to obtain a perovskite-type oxide with better crystallinity, i.e., an XRD intensity of $1\times10^4$ cps or more.

It is evident from the above results that the growth control layer preferably has a film thickness of from 0.63 nm to 170 nm, more preferably from 0.63 nm to 40 nm.

Discussion on Deposition Temperature

Figure 7:
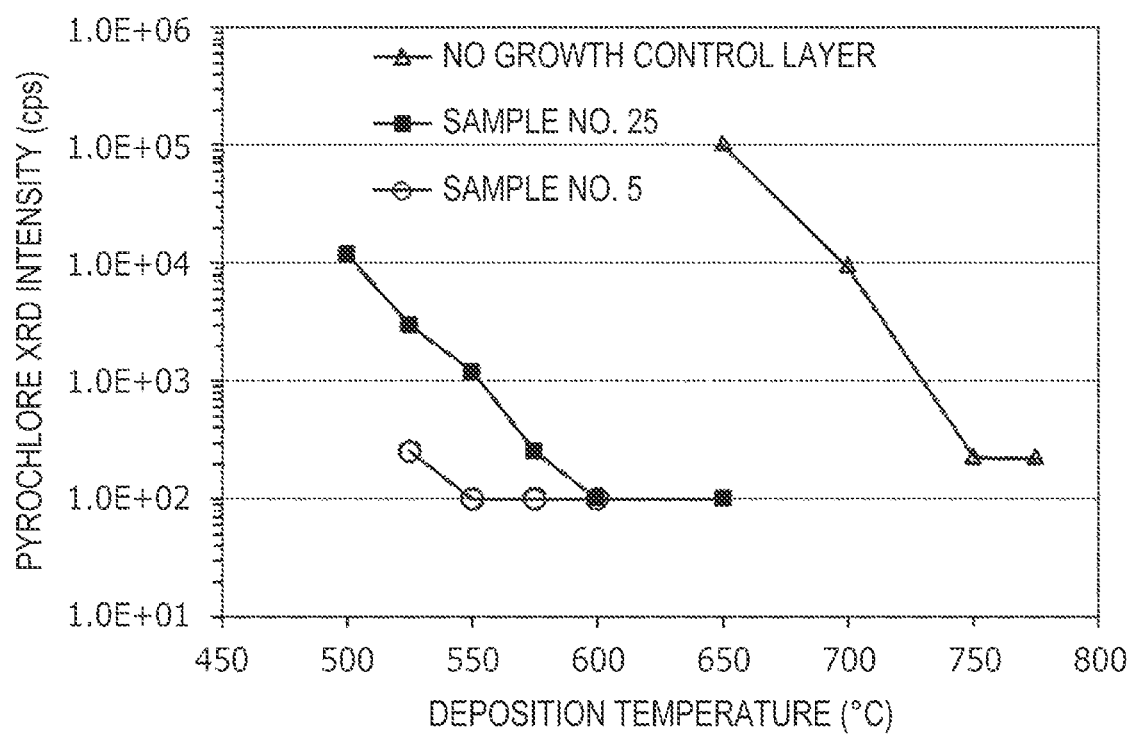
FIG. 7 is a graph showing the relationship between the deposition temperature of a PZT film and the XRD intensity of a pyrochlore phase.

FIG. 7 shows the relationship between the deposition temperature and the XRD intensity of a pyrochlore phase for PZT films obtained by deposition at different deposition temperatures for cases where, of the samples fabricated in Test 1 above, as examples, $Ba_{0.45}Ru_{0.55}O_e$ for Sample No. 5 and $Sr_{0.46}Ru_{0.54}O_e$ for Sample No. 25 were used as growth control layers. For comparison, FIG. 7 also shows a case where no growth control layer was provided and a PZT film was directly deposited on the lower electrode layer.

In the case where no growth control layer was provided, a PZT film with relatively inhibited pyrochlore phase was obtained at 750° C., although it was impossible to eliminate a pyrochlore phase. As shown in FIG. 7, the lowest temperature (PZT deposition temperature) at which a good perovskite structure free of a pyrochlore phase was obtained was 550° C. for Sample No. 5 and 600° C. for Sample No. 25. It is evident that the presence of a growth control layer can not only inhibit a pyrochlore phase, but also reduce the deposition temperature. For Sample No. 5, in which the electronegativity satisfies the conditions of the present disclosure, it was possible to obtain a PZT film with sufficiently inhibited pyrochlore phase at a deposition temperature of 525° C. Thus, the techniques of the present disclosure are effective in not only inhibiting a pyrochlore phase, but also considerably reducing the deposition temperature. Because a PZT film can be deposited at low deposition temperature, temperature control can be further simplified, and the manufacturing cost can be reduced.

Verification Experiment 1

PZT films containing different amounts of Pb were formed and examined for the range where a perovskite structure could be obtained for cases where $Ba_{0.45}Ru_{0.55}O$ was used as a growth control layer, $Sr_{0.46}Ru_{0.54}O$ was used as a growth control layer, and no growth control layer was provided.

The fabrication method was the same as the above sample fabrication method. However, a plurality of targets containing different amounts of Pb were provided, and PZT films containing varying amounts of Pb were deposited.

In Table 4, when a plurality of samples of perovskite structures were obtained at substrate temperatures in the range of 525° C. to 750° C. for each of the PZT films containing different amounts of Pb, the sample with the best crystallinity was evaluated. The crystallinity evaluation was performed on the same scale as above. Samples that were not fabricated or evaluated are denoted by "-" in Table 4. The crystallinity of perovskite was evaluated by calculating the XRD intensity of a pyrochlore phase using XRD in the same manner as above.

TABLE 4

| Amount of Pb Pb/(Zr + Ti + Nb) | $Ba_dRu_{1-d}O$ (Ba:Ru = 45:55) | $Sr_dRu_{1-d}O$ (Sr:Ru = 46:54) | No growth control layer |
|---|---|---|---|
| 0.672 | B | B | — |
| 0.771 | B | B | — |
| 0.862 | B | B | — |
| 0.873 | B | B | — |
| 0.901 | B | B | — |
| 0.961 | B | B | — |
| 1.065 | A | A | C |
| 1.081 | A | A | B |
| 1.121 | A | A | B |
| 1.163 | A | A | B |
| 1.201 | A | A | C |
| 1.212 | A | A | — |
| 1.251 | A | B | — |
| 1.261 | A | C | — |
| 1.302 | A | — | — |
| 1.352 | A | — | — |
| 1.451 | A | — | — |

As shown in Table 4, when $Ba_{0.45}Ru_{0.55}O$, which satisfies an electronegativity of less than 0.95, was used as a growth control layer, it was possible to set the amount of Pb in the PZT film over a very wide range compared to the case where $Sr_{0.46}Ru_{0.54}O$ was used or no growth control layer was provided. Thus, because a PZT film of a good perovskite structure with inhibited pyrochlore phase can be deposited over a wide range of amounts of Pb, it is possible to provide a piezoelectric element including a piezoelectric film having suitable piezoelectricity for each device to which the piezoelectric element according to the present disclosure is applied.

REFERENCE SIGNS LIST 1 piezoelectric element
10 substrate
12 lower electrode layer
14 growth control layer
16 piezoelectric layer
18 upper electrode layer

What is claimed is:
1. A piezoelectric element comprising, in sequence:
a substrate;
a lower electrode layer;
a growth control layer;
a piezoelectric layer including, as a main component, a perovskite-type oxide containing lead; and
an upper electrode layer,
wherein the growth control layer has a structure that does not have a perovskite structure and an oxygen octahedral structure and is a structure that does not lattice match with the piezoelectric layer, wherein the growth control layer includes a metal oxide represented by the following general formula (1):

$$M_d N_{1-d} O_e \quad (1)$$

where

M comprises one or more metal elements capable of substituting in the perovskite-type oxide and has an electronegativity of less than 0.95, N includes, as a main component, at least one selected from the group consisting of Sc, Zr, V, Nb, Ta, Cr, Mo, W, Mn, Fe, Ru, Co, Ir, Ni, Cu, Zn, Ga, Sn, In, and Sb, O is oxygen, and d and e each represent a compositional ratio, where 0<d<1, and when the electronegativity is X, $$1.41X - 1.05 \leq d \leq A1 \cdot \exp(-X/t1) + y0$$

where $A1 = 1.68 \times 10^{12}$, $t1 = 0.0306$, and $y0 = 0.59958$.

2. The piezoelectric element according to claim 1, wherein M in general formula (1) includes, as a main component, at least one selected from the group consisting of Li, Na, K, Mg, Ca, Sr, Ba, La, Cd, and Bi.

3. The piezoelectric element according to claim 1, wherein M in general formula (1) includes Ba as a main component.

4. The piezoelectric element according to claim 1, wherein M in general formula (1) is Ba.

5. The piezoelectric element according to claim 1, wherein $0.2 \leq d$.

6. The piezoelectric element according to claim 1, wherein $0.3 \leq d$.

7. The piezoelectric element according to claim 1, wherein $0.45 \leq d$.

8. The piezoelectric element according to claim 1, wherein the growth control layer has a film thickness of from 0.63 nm to 170 nm.

9. The piezoelectric element according to claim 1, wherein the growth control layer has a film thickness of from 0.63 nm to 40 nm.

10. The piezoelectric element according to claim 1, wherein N in general formula (1) is at least one selected from the group consisting of Ru, Ir, Sn, Ni, Co, Ta, and Nb.

11. The piezoelectric element according to claim 1, wherein M in general formula (1) includes Ba, N in general formula (1) is selected from the group consisting of Ru, Ir, Sn, Ni, Co, Ta, and Nb, and the growth control layer has a film thickness of from 0.63 nm to 40 nm.

12. The piezoelectric element according to claim 1, wherein the growth control layer is formed of an amorphous structure.

* * * * *